US008116676B2

(12) United States Patent
Rofougaran et al.

(10) Patent No.: US 8,116,676 B2
(45) Date of Patent: Feb. 14, 2012

(54) METHOD AND SYSTEM FOR INTER IC COMMUNICATIONS UTILIZING A SPATIAL MULTI-LINK REPEATER

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 952 days.

(21) Appl. No.: 12/116,763

(22) Filed: May 7, 2008

(65) Prior Publication Data

US 2009/0280768 A1 Nov. 12, 2009

(51) Int. Cl.
*H04B 7/14* (2006.01)
(52) U.S. Cl. ............................ 455/20; 455/25; 455/66.1
(58) Field of Classification Search ................ 455/7, 15, 455/16, 20, 21, 22, 25, 41.1, 41.2, 66.1
See application file for complete search history.

(56) References Cited

U.S. PATENT DOCUMENTS

| | | |
|---|---|---|
| 5,003,622 A | 3/1991 | Ma et al. |
| 5,015,972 A | 5/1991 | Cygan et al. |
| 5,200,955 A | 4/1993 | McFarlane et al. |
| 5,798,567 A | 8/1998 | Kelly et al. |
| 5,861,853 A | 1/1999 | Haub et al. |
| 5,914,873 A | 6/1999 | Blish |
| 6,060,433 A | 5/2000 | Li et al. |
| 6,573,808 B1 | 6/2003 | Burin |
| 6,646,581 B1 | 11/2003 | Huang |
| 6,697,603 B1 | 2/2004 | Lovinggood et al. |
| 6,809,581 B2 | 10/2004 | Rofougaran et al. |
| 6,853,257 B2 | 2/2005 | Yonekawa |
| 7,038,625 B1 | 5/2006 | Taylor |
| 7,081,800 B2 | 7/2006 | He et al. |
| 7,138,884 B2 | 11/2006 | Cheung et al. |
| 7,247,932 B1 | 7/2007 | Lin et al. |
| 7,260,424 B2 | 8/2007 | Schmidt |
| 7,469,152 B2 | 12/2008 | Cetiner et al. |
| 7,813,451 B2 * | 10/2010 | Binder et al. ................. 375/316 |

(Continued)

FOREIGN PATENT DOCUMENTS

CN 1716695 1/2006

(Continued)

OTHER PUBLICATIONS

Perndl, "Monolithic Microwave Integrated Circuits in SiGe:C Bipolar Technology" Dissertation, Nov. 2004.

*Primary Examiner* — Nguyen Vo
(74) *Attorney, Agent, or Firm* — Farjami & Farjami LLP (57) ABSTRACT

Aspects of a method and system for inter integrated circuit (IC) communications utilizing a spatial multilink repeater are provided. In this regard, one or more circuits in an integrated circuit may be enabled to receive a signal and repeat the received signal to a plurality of target integrated circuits. The repeated signals may be generated by frequency shifting the received signal and a different frequency shift may be utilized for each of the repeated signals. In this regard, each of the repeated signals may be generated by quadrature down-converting the received signal by mixing it with a first local oscillator pair, up-converting the down-converted signal by mixing it with a second local oscillator pair, and adding or subtracting an in-phase portion of the up-converted signal with a quadrature-phase portion of the up-converted signal.

20 Claims, 5 Drawing Sheets

U.S. PATENT DOCUMENTS

| | | |
|---|---|---|
| 2002/0039026 A1 | 4/2002 | Stroth et al. |
| 2002/0183003 A1* | 12/2002 | Chang et al. ............... 455/41 |
| 2004/0041732 A1 | 3/2004 | Aikawa et al. |
| 2004/0150483 A1 | 8/2004 | Cho |
| 2004/0150554 A1 | 8/2004 | Stenger et al. |
| 2004/0201526 A1 | 10/2004 | Knowles et al. |
| 2004/0207504 A1 | 10/2004 | Yang et al. |
| 2004/0222506 A1 | 11/2004 | Wei et al. |
| 2005/0012675 A1 | 1/2005 | Sakiyama et al. |
| 2005/0075080 A1* | 4/2005 | Zhang ............... 455/73 |
| 2005/0104665 A1 | 5/2005 | Molnar et al. |
| 2005/0212642 A1 | 9/2005 | Pleskach et al. |
| 2005/0270135 A1 | 12/2005 | Chua et al. |
| 2006/0033671 A1 | 2/2006 | Chan et al. |
| 2006/0091958 A1 | 5/2006 | Bhatti et al. |
| 2006/0092079 A1 | 5/2006 | deRochemont |
| 2006/0152911 A1 | 7/2006 | Humbert et al. |
| 2006/0172719 A1 | 8/2006 | Chen et al. |
| 2006/0189294 A1* | 8/2006 | Goodnow et al. ............ 455/333 |
| 2007/0013051 A1 | 1/2007 | Heyan et al. |
| 2007/0139112 A1 | 6/2007 | Bocock et al. |
| 2007/0194911 A1 | 8/2007 | Page |
| 2007/0205748 A1 | 9/2007 | Abou |
| 2008/0048760 A1 | 2/2008 | El Rai et al. |
| 2008/0291115 A1 | 11/2008 | Doan et al. |
| 2009/0153260 A1 | 6/2009 | Rofougaran |
| 2009/0153421 A1 | 6/2009 | Rofougaran et al. |
| 2009/0153427 A1 | 6/2009 | Rofougaran |
| 2009/0156157 A1 | 6/2009 | Rofougaran et al. |
| 2009/0179814 A1 | 7/2009 | Park et al. |
| 2009/0189064 A1 | 7/2009 | Miller et al. |
| 2009/0243741 A1 | 10/2009 | Rofougaran |
| 2009/0243749 A1 | 10/2009 | Rofougaran |
| 2009/0243767 A1 | 10/2009 | Rofougaran |
| 2009/0247109 A1 | 10/2009 | Rofougaran |
| 2009/0247213 A1 | 10/2009 | Rofougaran |
| 2009/0278596 A1 | 11/2009 | Rofougaran et al. |
| 2009/0279593 A1 | 11/2009 | Rofougaran et al. |
| 2009/0316829 A1 | 12/2009 | Rofougaran |
| 2009/0318086 A1 | 12/2009 | Rofougaran |
| 2010/0090902 A1 | 4/2010 | Thompson et al. |
| 2010/0159859 A1 | 6/2010 | Rofougaran |

FOREIGN PATENT DOCUMENTS

| | | |
|---|---|---|
| EP | 1146592 | 10/2001 |
| JP | 403019358 | 1/1991 |
| KR | 20050065395 | 6/2005 |
| KR | 20060087503 | 8/2006 |
| WO | W09621255 A1 | 7/1996 |

* cited by examiner

METHOD AND SYSTEM FOR INTER IC COMMUNICATIONS UTILIZING A SPATIAL MULTI-LINK REPEATER

CROSS-REFERENCE TO RELATED APPLICATIONS/INCORPORATION BY REFERENCE

This patent application makes reference to:
U.S. patent application Ser. No. 12/057,780, filed on Mar. 28, 2008, now published as 2009/0247109;
U.S. patent application Ser. No. 12/058,077, filed on Mar. 28, 2008, now published as 2009/0247075;
U.S. patent application Ser. No. 12/116,581 filed on May 7, 2008, now published as 2009/0278596; and
U.S. patent application Ser. No. 12/116,835 filed on May 7, 2008, now published as 2009/0279593.

Each of the above stated applications is hereby incorporated herein by reference in its entirety.

FIELD OF THE INVENTION

Certain embodiments of the invention relate to signal processing. More specifically, certain embodiments of the invention relate to a method and system for inter integrated circuit (IC) communications utilizing a spatial multilink repeater.

BACKGROUND OF THE INVENTION

In the rapidly evolving world of wireless communications, new protocols are continually being developed which operate at higher and higher frequencies. For example, in 2001, the Federal Communications Commission (FCC) designated a large contiguous block of 7 GHz bandwidth for communications in the 57 GHz to 64 GHz spectrum. This frequency band was designated for use on an unlicensed basis, that is, the spectrum is accessible to anyone, subject to certain basic, technical restrictions such as maximum transmission power and certain coexistence mechanisms. The communications taking place in this band are often referred to as '60 GHz communications'.

In this regard, communication at extremely high frequencies (EHF) may enable reducing the size of corresponding communication systems due, for example, to the smaller passive components required. Additionally, EHF systems may enable higher data rates than their lower frequency counterparts. However, a major drawback of operating at extremely high frequencies is that EHF signals have substantially different characteristics in terms of signal propagation than lower frequency signals. In this regard, EHF signals may only be suited for "line-of-site" operation.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for inter integrated circuit (IC) communication utilizing a spatial multi-link repeater, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for inter integrated circuit (IC) communications utilizing a spatial multilink repeater. In this regard, one or more circuits in an integrated circuit may be enabled to receive a signal and repeat the received signal to a plurality of target integrated circuits. The signal may be received via a first antenna and the repeated signals may be transmitted via a second antenna. In various embodiments of the invention, at least a portion of the antennas may be fabricated on and/or within the integrated circuit and/or a package to which the integrated circuit may be bonded. The repeated signals may be generated by frequency shifting the received signal and a different frequency shift may be utilized for each of the repeated signals. In this regard, each of the repeated signals may be generated by quadrature down-converting the received signal by mixing it with a first local oscillator pair, up-converting the down-converted signal by mixing it with a second local oscillator pair, and adding or subtracting an in-phase portion of the up-converted signal with a quadrature-phase portion of the up-converted signal.

Figure 1:
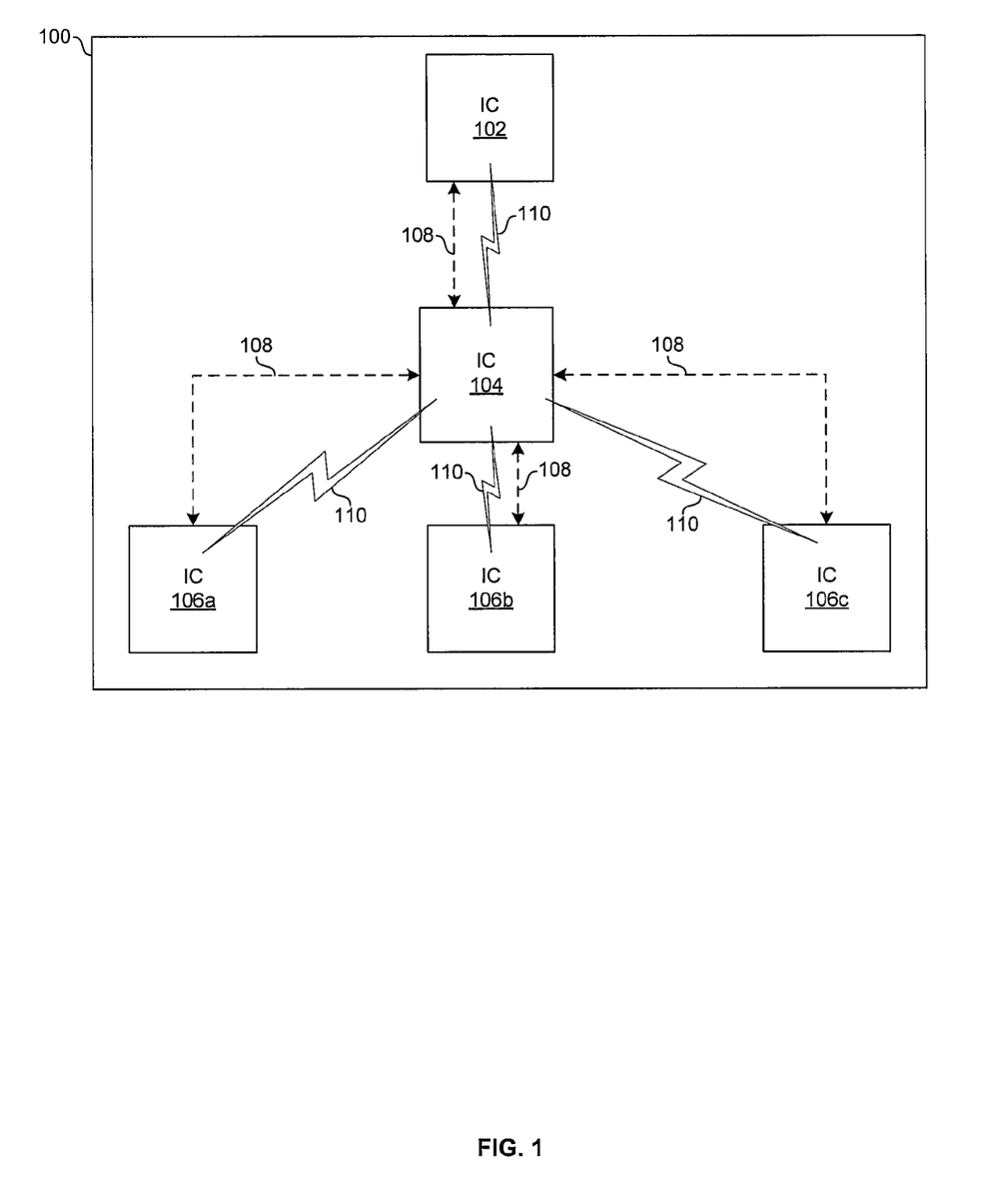
FIG. 1 is diagram of an exemplary system comprising a plurality of integrated circuits which are enabled to provide inter integrated circuit communications utilizing a spatial multilink repeater, in accordance with an embodiment of the invention.

FIG. 1 is diagram of an exemplary system comprising a plurality of integrated circuits which are enabled to provide inter integrated circuit communications utilizing a spatial multilink repeater, in accordance with an embodiment of the invention. Referring to FIG. 1 there is shown a printed circuit board (PCB) 100 comprising integrated circuits 102, 104, and 106a, 106b, 106c. The ICs 106a, 106b, 106c may be collectively referred to as ICs 106.

The PCB 100 may, for example, be a motherboard in a computing and/or wireless communications device. In this regard, the ICs 102, 104, and 106 may be mounted to the PCB 100 and thus the PCB 100 may mechanically support and/or electrically couple the ICs 102, 104, and 106. Without limiting the invention in any respect, the PCB 100 may be referred to by various names such as a printed circuit assembly (PCA), printed wiring board (PWB), and etched wiring assembly.

Each of the ICs 102, 104, and 106 may comprise suitable logic, circuitry, and/or code for transmitting and/or receiving wireless signals. Each of the ICs 102, 104, and 106 may be bonded to a multi-layer package which may also comprise suitable logic, circuitry and/or code to enable wireless communications. In this regard, the ICs 102, 104, and 106 may be referred to as hybrid and/or hybridized circuits. In some embodiments of the invention, one or more of the ICs 102, 104, and 106 may comprise suitable logic, circuitry, and/or code that may enable processing of any form of signals such as, for example, multimedia information, comprising, audio, video, and/or data. Audio may comprise voice, any form of music, and/or any form of sound. The processing of signals by the ICs 102, 104, and 106 may occur in analog and/or digital format.

In various embodiments of the invention, the IC 104 may comprise a repeater and may be dedicated to receiving signals and repeating the received signals without extracting information from or performing additional processing on the received signals. In various other embodiments of the invention, the IC 104 may comprise suitable logic, circuitry, and/or code that may be enable extraction of information from and/or performing additional processing of received signals in addition to repeating the received signals.

In operation, wireless signals 110 may be communicated between the ICs 102, 104, and 106. For example, the IC 102 may transmit EHF signals to the ICs 112. However, due to the physical placement of the ICs 102, 104, and 106 on the PCB 100 and/or due to other physical obstructions between the ICs 102, and 106, there may be no line-of-sight path for reliably communicating EHF signals. Accordingly, the IC 104 may re-transmit, or repeat, the signals received from the IC 102 to one or more other ICs such as the ICs 106. The ICs 102 and 106 may or may not be aware of the presence of the IC 104. Accordingly, the repeating of the signals from the IC 102 may be transparent to the operation of the IC 102 and/or the ICs 106. In some instances, a signal may be repeated multiple times before arriving at a target IC. For example, a PCB similar to the PCB 100 of FIG. 1 may comprise a plurality of the IC 104 and a signal from the IC 102 may be received by a first IC $104_1$ which may repeat the signal to a second IC $104_2$ and the second IC $104_2$ may then repeat the signal to a target IC 106.

In operation, signals received by a repeater may be frequency shifted to generate the repeated signals. In this regard, an amount of frequency shift applied to the received signal may be determined, for example, based on a transmit frequency of the IC 102 and/or based on a receive frequency of one or more of the ICs 106. For example, each of the ICs 106 may receive on a different frequency and thus the frequency shift applied by IC 104 may determine which of the ICs 106 may receive the repeated signal. Additionally, repeated signals may comprise a plurality of signal components and a phase and/or amplitude of the signal components may be adjusted to control the directivity of the repeated signals. In this regard, attributes of the wireless signals 1120 may be determined via control/configuration connections 108, which may be, for example, wireline connections or wireless connections utilizing a different protocol such as Bluetooth.

Figure 2:
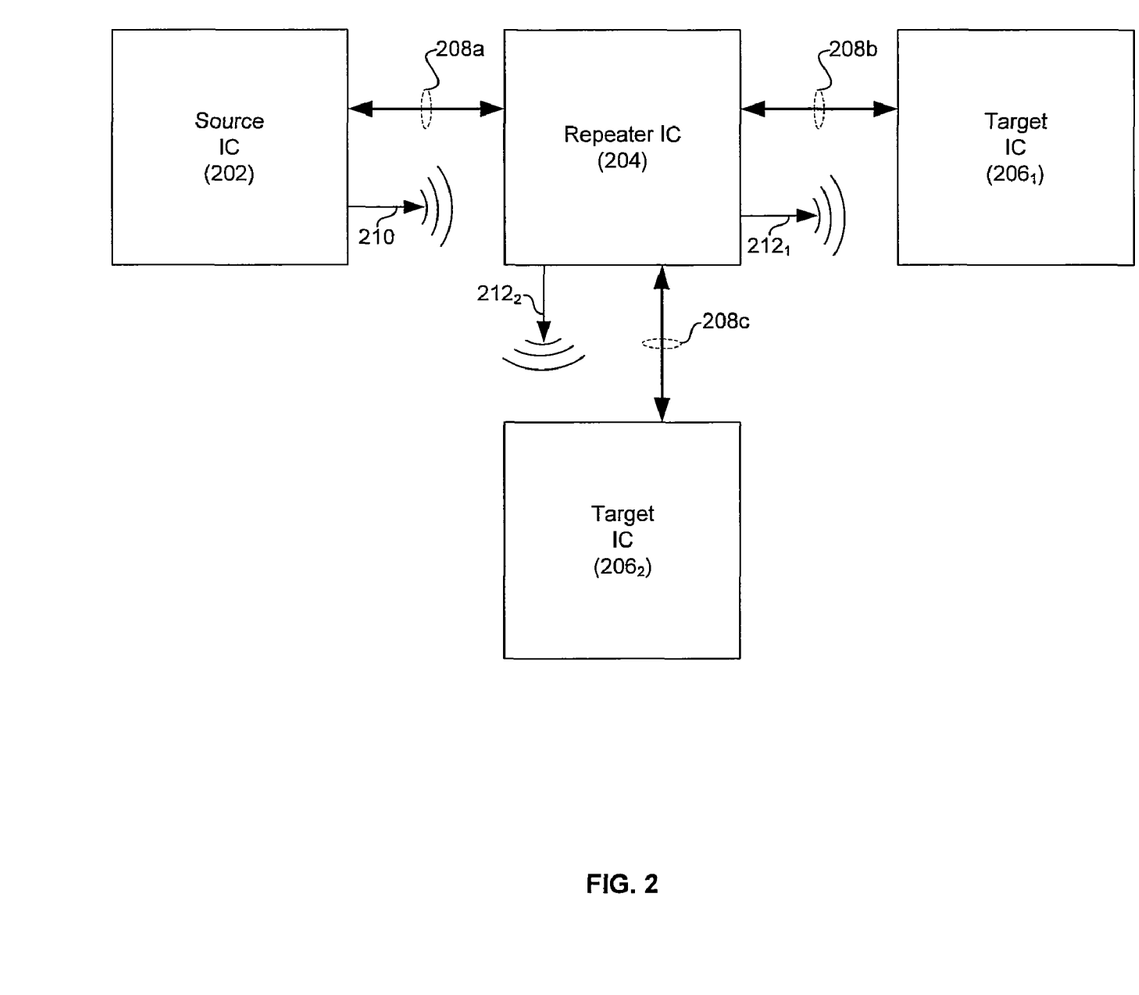
FIG. 2 is a block diagram illustrating a repeater device utilized to forward wireless communications from a source IC to a plurality of target ICs, in accordance with an embodiment of the invention.

FIG. 2 is a block diagram illustrating a repeater device utilized to forward wireless communications from a source IC to a plurality of target ICs, in accordance with an embodiment of the invention. Referring to FIG. 2, there is shown a source IC 202; a repeater IC 204; target ICs $206_1, \ldots, 206_N$; transmitted signal 210, repeated signals $212_1, \ldots, 212_N$; and control connections 208a, 208b, and 208c, 208, $209_1, \ldots, 209_N$, where N may be the number of target ICs to which the signal 210 may be repeated. The system 200 is only exemplary and other systems may comprise additional source ICs, repeater ICs, and/or target ICs without deviating from the scope of the present invention. Additionally, one or more of the target ICs $206_1, \ldots, 206_N$ may comprise suitable logic, circuitry, and/or code that may enable repeating signals.

The source IC 202 and the target ICs $206_1, \ldots, 206_N$ may each comprise suitable logic, circuitry, and/or code that may enable receiving, transmitting, and processing of RF signals. In this regard, one or more of the source IC 202 and the target ICs $206_1, \ldots, 206_N$ may enable processing of any form of signals such as, for example, multimedia information, comprising, audio, video, and/or data. Audio may comprise voice, any form of music, and/or any form of sound. The processing of signals by the ICs 202 and 206 may occur in analog and/or digital format. Additionally, one or more of the ICs 202 and $206_1, \ldots, 206_N$ may be bonded to a multi-layer package. In this regard, circuit elements supporting wireless communications, such as passive components and/or antennas, may be fabricated on and/or within the IC package(s).

The repeater IC 204 may comprise suitable logic, circuitry, and/or code that may enable reception and/or transmission of RF signals to facilitate forwarding an RF signal from the source IC 202 to the target ICs $206_1, \ldots, 206_N$. The repeater IC 204 may be configured based on information received via the control connections 208, $209_1, \ldots, 209_N$. Accordingly, the repeater IC 204 may be enabled to control directionality of the repeated signals $212_1, \ldots, 212_N$ so as to direct the signals $212_1, \ldots, 212_N$ to the target ICs $206_1, \ldots, 206_N$, respectively. In this regard, repeated signals $212_1, \ldots, 212_N$ may each comprise a plurality of signal components and the repeater IC 204 may be enabled to control a phase and/or amplitude of the signal components based on the physical location of the target ICs $206_1, \ldots, 206_N$. Additionally, the repeater IC 204 may be enabled to control a frequency of each of the repeated signals $212_1, \ldots, 212_N$. In various embodiments of the invention, the IC 204 may be bonded to a multi-layer package and circuit components supporting wireless communications, such as passive components and/or antennas, may be fabricated on and/or within the IC package(s).

In various embodiments of the invention, the IC 204 may operate as a repeater and may be dedicated to receiving signals and repeating the received signals without extracting information from or performing additional processing on the received signals. In various other embodiments of the invention, the IC 204 may comprise suitable logic, circuitry, and/or code that may be enable extraction of information from and/or performing additional processing of received signals in addition to repeating the received signals. In this regard, the IC 204 may be enabled to process any form of signals such as, for example, multimedia information, comprising, audio, video, and/or data. Audio may comprise voice, any form of music, and/or any form of sound. The processing of signals by the IC 204 may occur in analog and/or digital format.

The control connections 208, $209_1, \ldots, 209_N$ may each comprise a wireless and/or wireline link that may be utilized to communicate control messages between the source IC 202 and the repeater IC 204, and between the repeater IC 204 and the target ICs $206_1, \ldots, 206_N$, respectively. For example, the control connections 208, $209_1, \ldots, 209_N$ may be utilized to determine the target ICs $206_1, \ldots, 206_N$ for a received signal 210, determine a receive frequency of each of the target ICs $206_1, \ldots, 206_N$, and/or determine directionality from the repeater IC 204 to each of the target ICs $206_1, 206_N$. Exemplary links may comprise a Bluetooth connection and a three wire interface.

In operation, the source IC 202 may transmit a signal 210 destined for the target ICs $206_1, \ldots, 206_N$. However, due to factors such as distance and/or physical obstructions, signals from the source IC 202 may not reliably reach one or more the target ICs $206_1, \ldots, 206_N$. For example, extremely high frequency (EHF) communications may be limited to line-of-sight operation. Accordingly, the repeater IC 204 may receive the signal 210, having a first frequency, from the source device 202 and repeat, or re-transmit, the received signal 210 as signals $212_1, \ldots, 212_N$, to the target ICs $206_1, \ldots, 206_N$, respectively. The frequency of each of the repeated signals $212_1, \ldots, 212_N$ may be controlled based on the target ICs $206_1, \ldots, 206_N$ and/or based on the environment in which the signals $212_1, \ldots, 212_N$ may be transmitted. In this regard, the frequency of the received signal 210 may be shifted to match the receive frequencies of the target ICs $206_1, \ldots, 206_N$ and/or to mitigate any sort of interference such as avoiding noisy frequencies. Additionally, the repeated signals $212_1, \ldots, 212_N$ may be directed to the destination target ICs $206_1, \ldots, 206_N$. In this regard, the repeated signals $212_1, 212_N$ may each comprise a plurality of signal components transmitted via a corresponding plurality of antenna elements and the phase and/or amplitude of the signal components may be controlled to affect the directionality of each of the transmitted signals $212_1, \ldots, 212_N$.

Figure 3:
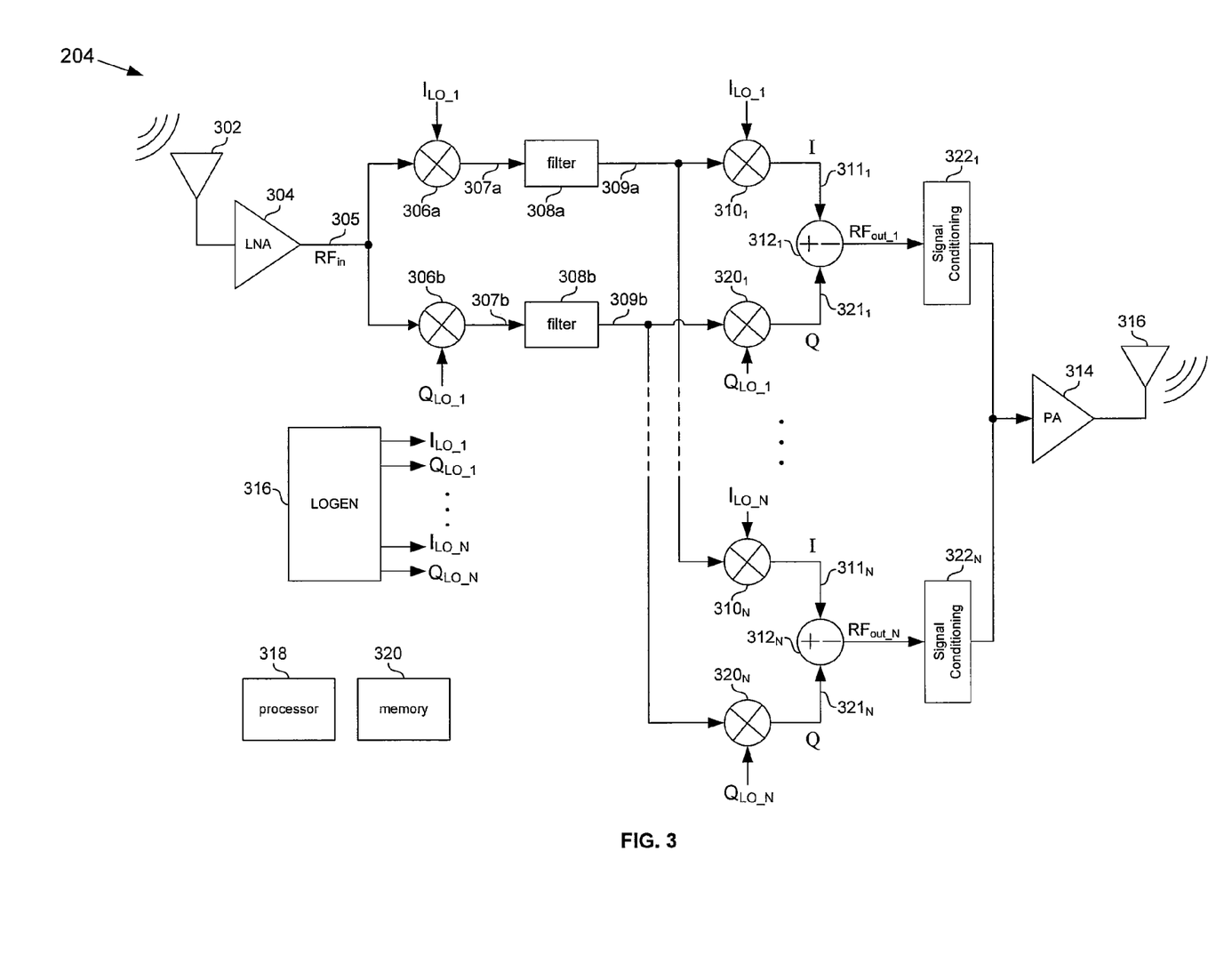
FIG. 3 is a diagram of an exemplary multilink frequency shifting repeater, in accordance with an embodiment of the invention.

FIG. 3 is a diagram of an exemplary frequency shifting repeater, in accordance with an embodiment of the invention. Referring to FIG. 3, the repeater 204 may comprise a low noise amplifier (LNA) 304; mixers 306a, 306b, $310_1, \ldots, 310_N$, and $320_1, \ldots, 320_N$; filters 308a and 308b; adders $312_1, \ldots, 312_N$; power amplifier (PA) 314; signal conditioning blocks $322_1, \ldots, 322_N$; local oscillator generator (LOGEN) 316; processor 318; and memory 320, where N may be the number of target ICs to which a received signal may be repeated. The repeater 204 may comprise or be communicatively coupled to antennas 302 and 316.

The antennas 302 and 316 may be enabled for transmitting and/or receiving of EHF signals. In various embodiments of the invention, the antennas may be fabricated on-chip and/or may be fabricated on and/or within a multi-layer integrated circuit package.

The LNA 304 may comprise suitable logic, circuitry, and/or code that may enable buffering and/or amplification of received RF signals. In this regard, the gain of the LNA 304 may be adjustable to enable reception of signals of varying strength. Accordingly, the LNA 304 may receive one or more control signals from the processor 318 and/or the memory 320.

The mixers 306a and 306b may each comprise suitable logic, circuitry, and/or code that may enable generation of inter-modulation products resulting from mixing the received signal $RF_{IN}$ with the in-phase local oscillator (LO) signal $I_{LO\_1}$ and the quadrature-phase LO signal $Q_{LO\_1}$, respectively. Similarly, the mixers $310_k$ and $320_k$, where k may be an integer between 1 and N, may each comprise suitable logic, circuitry, and/or code that may enable generation of inter-modulation products resulting from mixing the filter outputs 309a and 309b with $I_{LO\_k}$ and $Q_{LO\_k}$, respectively.

The filters 308a and 308b may each comprise suitable, logic, and/or code that may enable passing frequencies at or near a desired intermediate frequency (IF) and attenuating other frequencies. In this regard, the IF may be given by $f_{305}$-$f_{LO1}$, where $f_{305}$ may be the frequency of the signal 305 output by the LNA 304 and $f_{LO1}$ may be the frequency of the LO signal pair $I_{LO\_1}$, $Q_{LO\_1}$ output by the LOGEN 316. In various embodiments of the invention, the bandwidth, attenuation, and/or center frequency of each of the filters 308a and 308b may be adjustable based on one or more control signals. Accordingly, the filters 308a and 308b may each receive one or more control signals from the processor 318 and/or the memory 320.

The adders $312_1, \ldots, 312_N$ may each comprise suitable logic, circuitry, and/or code for adding or subtracting signals. In this regard, the adder $312_k$, may be enabled to add signal $311_k$ to signal $321_k$, subtract signal $311_k$ from signal $321_k$ and/or subtract signal $311_k$ from signal $321_k$. In this regard, the adder $312_k$ may receive one or more control signals to determine whether addition or subtraction is performed. Furthermore, the selection of addition or subtraction may depend on the phasing and/or polarity of one or more of the signals $I_{LO\_k}$, $Q_{LO\_k}$, 309a, and 309b. For example, $I_{LO\_k}$ may be $\cos(\omega_{LO\_k}t)$ and $Q_{LO\_k}$ may be $\sin(\omega_{LO\_k}t)$ and addition may be selected such that the output of the adder $312_k$ may be $\cos(\omega_{IF}t$-$\omega_{LO\_k}t)$, where $\omega_{IF}=\omega_{RFIn}$-$\omega_{LO\_1}$. Alternatively, $I_{LO\_k}$ may be $\cos(\omega_{LO\_k}t)$ and $Q_{LO\_k}$ may be $-\sin(\omega_{LO\_k}t)$ and subtraction may be selected such that the output of the adder $312_k$ may be $\cos(\omega_{IF}t$-$\omega_{LO\_k}t)$, where $\omega_{IF}=\omega_{RFin}$-$\omega_{LO\_1}$.

The PAs 314a and 314b may each comprise suitable logic, circuitry, and/or code that may enable buffering and/or amplification of an RF signal and outputting the resulting signal to an antenna for transmission. In this regard, the gain of the PAs 314a and 314b may be adjustable and may enable transmitting signals of varying strength. Accordingly, the PAs 314a and 314b may receive one or more control signals from the processor 318 and/or the memory 320.

The LOGEN 316 may comprise suitable logic, circuitry, and/or code that may enable generating local oscillator (LO) signal pairs $I_{LO\_1}$, $Q_{LO\_1}, \ldots, I_{LO\_k}$, $Q_{LO\_k}$. In various embodiments of the invention, the signal generator 316 may comprise, for example, one or more VCO's, PLLs, and/or direct digital frequency synthesizers (DDFSs). The frequency of the LO signals output by the LOGEN 316 may be determined based on one or more control signals from the processor 318 and/or the memory 320.

The processor 318 may comprise suitable logic, circuitry, and/or code that may enable control and/or data processing operations for the repeater 108. For example, the processor 318 may provide one or more control signals for configuring the filters 308 and/or the LOGEN 316.

The memory 320 may comprise suitable logic, circuitry, and/or code that may enable storage of data and/or other information utilized by the repeater 108. In this regard, the processor may be enabled to store received data and/or information for configuring and/or operating the repeater 108. For example, the memory 320 may store information for configuring the filters 308 and/or the LOGEN 316.

In operation, a signal may be received via the antenna 302 and amplified by the LNA 304 to generate the signal $RF_{in}$. The mixers 306a and 306b may mix $RF_{in}$ with the LO signal pair $I_{LO\_1}$, $Q_{LO\_1}$. In this regard, the processor 318 and/or the memory 320 may provide one or more signals for controlling the frequency of the LO signal pair $I_{LO\_1}$, $Q_{LO\_1}$ output by the LOGEN 316. The filters 308a and 308b may filter the output of the mixers 306a and 306b to generate intermediate frequency (IF) signals 309a and 309b. In this regard, the processor 318 and/or the memory 320 may provide one or more signals for controlling the response of the filters 308a and 308b. The mixers $310_k$ and $320_k$ may mix the IF signals 309a and 309b with the LO signal pair $I_{LO\_k}$, $Q_{LO\_k}$ to generate signals $311_k$ and $311_k$. The adder $312_k$ may add or subtract the signals $311_k$ and $311_k$ to generate $RF_{out\_k}$. In this manner, $RF_{out\_k}$ may be generated by frequency shifting $RF_{in}$ by $-(f_{LO\_1}+f_{LO\_k})$, where $f_{LO\_1}$ is the frequency of the LO signal pair $I_{LO\_1}$, $Q_{LO\_1}$ and $f_{LO\_k}$ is the frequency of the LO signal pair $I_{LO\_k}$, $Q_{LO\_k}$ output by the LOGEN 316. Accordingly, signals received via the antenna 302 may be repeated to k target ICs on k frequencies via the antenna 316. Additional details of operation of the repeater 204 may are described below with respect to FIG. 4.

Figure 4:
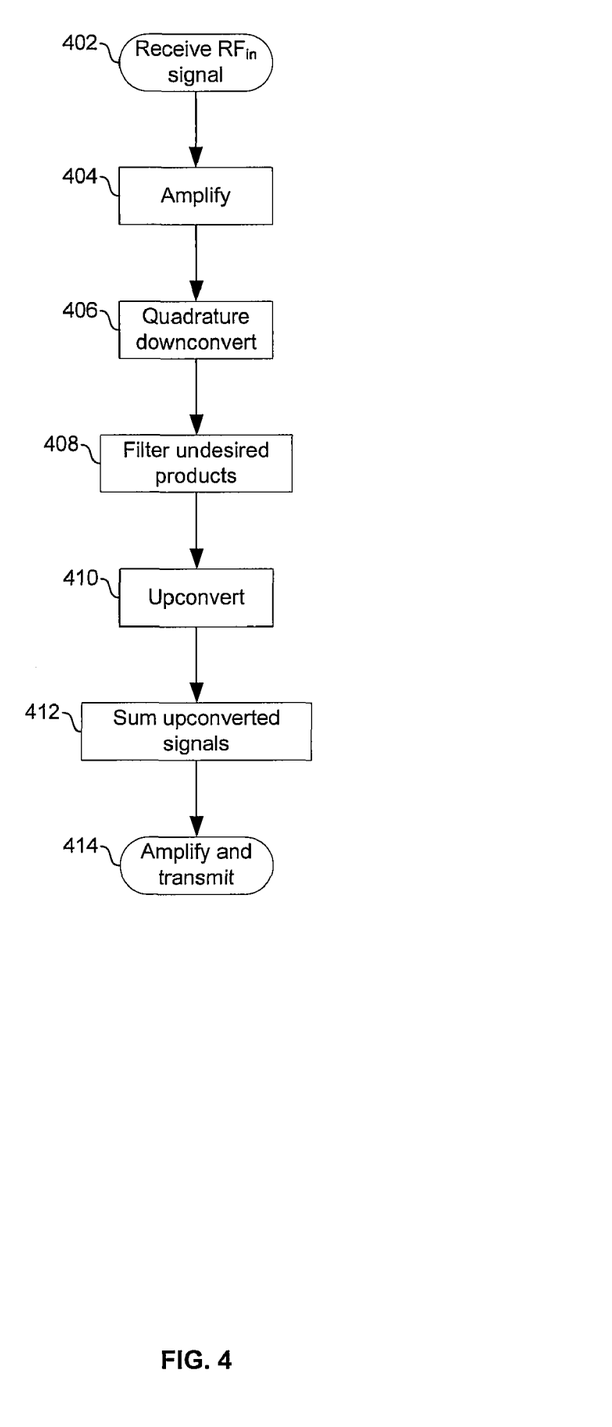
FIG. 4 is a flow chart illustrating exemplary operation of a multilink frequency shifting repeater, in accordance with an embodiment of the invention.

FIG. 4 is a flow chart illustrating exemplary operation of a frequency shifting repeater, in accordance with an embodiment of the invention. Referring to FIG. 4 the exemplary steps may begin with step 402 when a signal may be received by the repeater 108. Subsequent to step 402, the exemplary steps may advance to step 404.

In step 404, the received RF signal may be amplified by the low noise amplifier 304. Subsequent to step 404, the exemplary steps may advance to step 406.

In step 406, the amplified RF signal 305 output by the LNA 304 may be quadrature down converted. In this regard, the mixer 306a may mix the signal 305 with an in-phase local oscillator signal, $I_{LO\_1}$, and the mixer 306b may mix the signal 305 with a quadrature-phase local oscillator signal, $Q_{LO\_1}$. Subsequent to step 406, the exemplary steps may advance to step 408.

In step 408, the signals 307a and 307b output by the mixers 306a and 306b may be filtered to remove undesired mixer products. In this regard, the filter 308a may low pass filter the signal 307a and output $\cos(\omega_{RF}-\omega_{LO\_1})$ and the filter 308b may low pass filter the signal 307b and output $\sin(\omega_{RF}-\omega_{LO\_1})$. Subsequent to step 408, the exemplary steps may advance to step 410.

In step 410, the filtered signals 309a and 309b may be up-converted. In this regard, the mixer $310_k$ may mix the signal 309a with the in-phase local oscillator signal $I_{LO\_k}$ signal to generate $311_k$ and the mixer $320_k$ may mix the signal 309b with the quadrature-phase local oscillator signal $Q_{LO\_k}$ to generate $321_k$. Subsequent to step 410, the exemplary steps may advance to step 412.

In step 412, the adder $312_k$ may add or subtract the up-converted signals $311_k$ and $321_k$ to generate the $RF_{out\_k}$ signal. Accordingly, $RF_{out\_k}$ may be frequency shifted relative to the $RF_{in}$ signal by an amount equal to (within a tolerance) $-(f_{LO\_1}+f_{LO\_k})$. For example, if $RF_{in}$ is 61 GHz, $f_{LO\_1}$ is 250 MHz, and $f_{LO\_k}$ is 150 MHz then $RF_{out\_k}$ may be 60.6 GHz. In this manner, a received signal may be repeated on a different frequency than the frequency on which it is received. In this regard, the frequency of the transmitted signal $212_k$ may be determined based, for example, on a frequency of operation of the target IC $206_k$ and/or noise present in and/or around the repeater 108. Subsequent to step 412, the exemplary steps may advance to step 413.

In step 413, the signal $RF_{out\_k}$ may be conditioned by the signal conditioning block $322_k$ such that the repeated signal $212_k$ may be directed at the target device $206_k$. In this regard, the signal conditioning block $322_k$ may adjust a phase and/or amplitude of one or more components of the signal $RF_{out\_k}$. Subsequent to step 413, the exemplary steps may advance to step 414.

In step 414, $RF_{out\_k}$ may be amplified by the PA 314 and transmitted via the antenna 316 to the target device $212_k$. In this manner, a repeater may repeat an EHF signal to a plurality of target ICs, wherein each of the target devices may be in a different physical location and/or operating on a different frequency.

Figure 5:
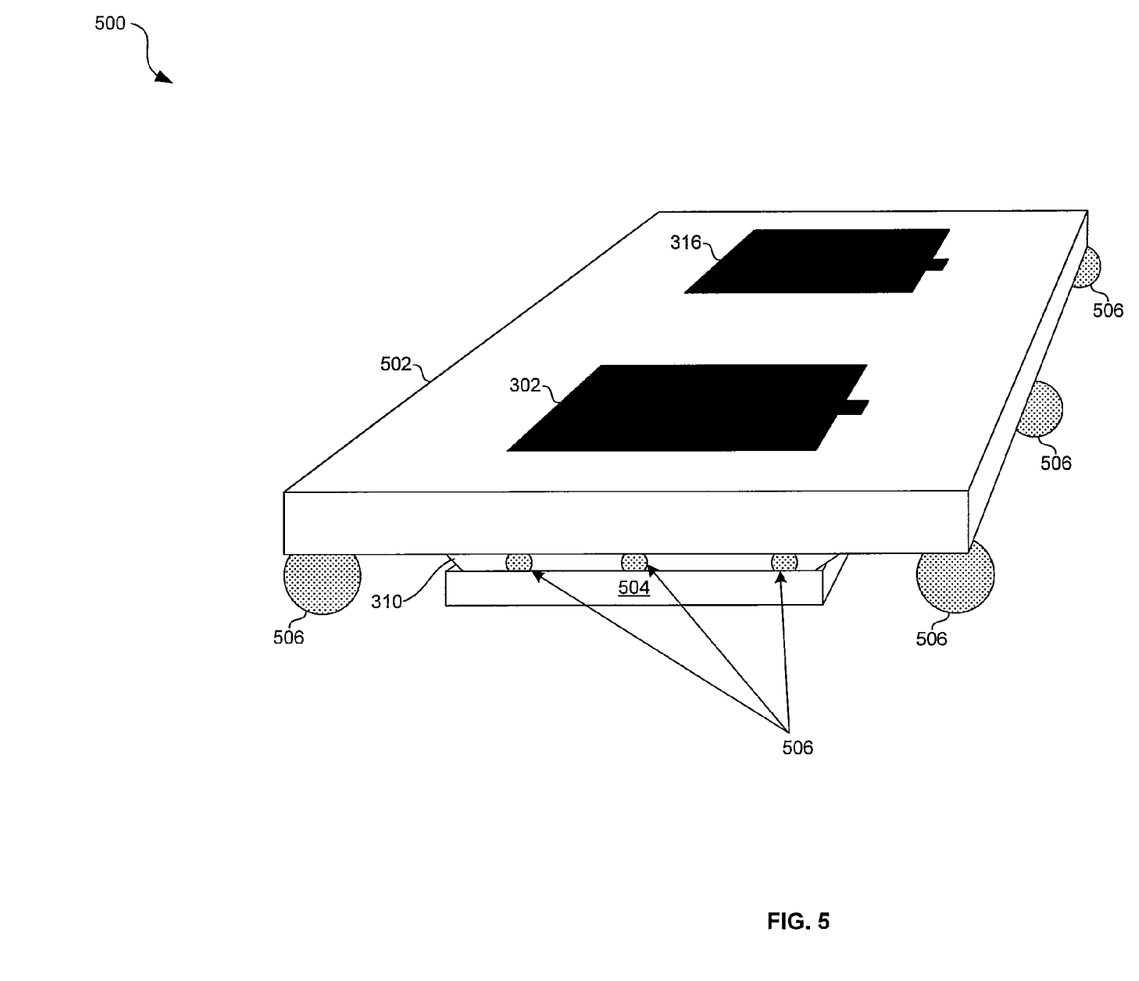
FIG. 5 illustrates an exemplary hybrid circuit comprising a multilink frequency shifting repeater, in accordance with an embodiment of the invention.

FIG. 5 illustrates an exemplary hybrid circuit comprising a spatial multilink repeater, in accordance with an embodiment of the invention. Referring to FIG. 5, the hybrid circuit 500 may comprise an Integrated circuit (IC) package 502, an associated IC ("chip") 504, antennas 302 and 316, and solder balls 506.

The IC 504 may be similar to, or the same as, the ICs 102, 104, 106, 202, 204, and/or 206 described with respect to FIGS. 1 and 2. The IC 504 may be bump-bonded or flip-chip bonded to the multi-layer IC package 502 utilizing the solder balls 506. In this manner, wire bonds connecting the IC 504 to the multi-layer IC package 502 may be eliminated, reducing and/or eliminating stray inductances due to wire bonds. In addition, the thermal conductance out of the IC 504 may be greatly improved utilizing the solder balls 506 and the thermal epoxy 510. The thermal epoxy 510 may be electrically insulating but thermally conductive to allow for thermal energy to be conducted out of the IC 504 to the much larger thermal mass of the multilayer package 502.

The solder balls 506 may comprise spherical balls of metal to provide electrical, thermal and physical contact between the IC 504 and the multi-layer IC package 502. In making the contact with the solder balls 506, the IC 504 may be pressed with enough force to squash the metal spheres somewhat, and may be performed at an elevated temperature to provide suitable electrical resistance and physical bond strength. The solder balls 506 may also be utilized to provide electrical, thermal and physical contact between the multi-layer IC package 502 and a printed circuit board, such as the PCB 100 of FIG. 1.

The multi-layer IC package 502 may comprise one or more layers of metal and/or insulating material (various embodiments may also comprise ferromagnetic and/or ferrimagnetic areas and/or layers). In this regard, the multi-layer IC package 502 may be fabricated in a manner similar to or the same as an integrated circuit. Accordingly, the layers may be utilized to realize circuit elements such as resistors, inductors, capacitors, transmission lines, switches (e.g., microelectromechanical switches), antennas, etc. In this regard, the antennas 302 and 316 may be fabricated in and/or on the multi-layer IC package 502. The antennas 302 and 316 may be fabricated in one or more metal layers in and/or on the multi-layer IC package 502. In this regard, microstrip and/or stripline may be utilized to delineate the antennas 302 and 316.

In operation, a signal may be received from a source IC via the antenna 502, processed in a manner as described with respect to FIGS. 3 and 4, and transmitted to one or more target ICs via the antenna 516.

Thus, aspects of a method and system for inter integrated circuit (IC) communications utilizing a spatial multilink repeater are provided. In this regard, one or more circuits in the integrated circuit 204 may be enabled to receive a signal 210 and repeat the received signal 210 to a plurality of target integrated circuits 206. The signal 210 may be received via a first antenna 302 and the repeated signals 212 may be transmitted via a second antenna 316. In various embodiments of the invention, at least a portion of the antennas 302 and/or 316 may be fabricated on and/or within the integrated circuit 204 and/or a package to which the integrated circuit may be bonded. The repeated signals 212 may be generated by frequency shifting the received signal 210 and a different frequency shift may be utilized for each of the repeated signals 212. In this regard, each of the repeated signals 212 may be generated by quadrature down-converting the received signal by mixing it, via mixers 306, with a first local oscillator pair $Q_{LO\_L}$ and $I_{LO\_1}$, up-converting the down-converted signal by mixing it, via mixer 310 and 320, with a second local oscillator pair $Q_{LO\_k}$ and $I_{LO\_k}$, and adding or subtracting, via the adder/subtractor $312_k$, an in-phase portion 311 of the up-converted signal with a quadrature-phase portion 321 of the up-converted signal.

In some embodiments of the invention, the integrated circuit 204 may be enabled to extract and/or process information from said received signal 210. In other embodiments of the invention, the integrated circuit 204 may repeat the signal 210 as one or more signals 212 without extracting information from or otherwise performing additional processing of the received signal 210.

In various embodiments of the invention, different target integrated circuits 206 may receive on different frequencies. Accordingly, the frequency shift applied to a repeated signal $212_k$ may be determined based on the target integrated circuit $210_k$ of the repeated signal $212_k$. Additionally, different target integrated circuits 206 may be in different physical locations. Accordingly, each of the repeated signals 212 may comprise one or more signal components and a phase and/or amplitude of each of the signal components may be adjusted to control a directivity of the repeated signals.

Another embodiment of the invention may provide a machine-readable storage, having stored thereon, a computer program having at least one code section executable by a machine, thereby causing the machine to perform the steps as described herein for inter integrated circuit (IC) communications utilizing a spatial multilink repeater.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
   receiving a first signal at a first integrated circuit via a first antenna;
   frequency shifting said first signal by a different amount to generate each of a plurality of repeated signals; and
   transmitting, via a second antenna, said generated plurality of repeated signals to a corresponding plurality of target integrated circuits, wherein:
      each of said plurality of repeated signals comprises one or more signal components; and
      a phase and/or amplitude of each of said one or more signal components is adjusted to control a directivity of each of said repeated signals.

2. The method according to claim 1, comprising generating each of said plurality of repeated signals by:
   quadrature down-converting said received first signal by mixing said received first signal with a first of a plurality of phase-quadrature local oscillator signal pairs, said down-converting resulting in a down-converted signal;
   up-converting said down-converted signal by mixing said down-converted signal with a second pair of said plurality of phase-quadrature local oscillator signal pairs, said up-converting resulting in an up-converted signal; and
   adding or subtracting an in-phase portion of said up-converted signal with a quadrature-phase portion of said up-converted signal.

3. The method according to claim 1, wherein at least a portion of said first antenna and/or said second antenna are fabricated on and/or within said integrated circuit.

4. The method according to claim 1, wherein at least a portion of said first antenna and/or said second antenna are fabricated on and/or within a package to which said first integrated circuit is bonded.

5. The method according to claim 1, wherein said first integrated circuit is enabled to extract and/or process information from said received signal.

6. The method according to claim 1, comprising transmitting signals from a source integrated circuit to a target integrated circuit via a plurality of said first integrated circuit.

7. The method according to claim 6, wherein a first portion of said plurality of target integrated circuits receive signals on a different frequency than a remaining portion of said plurality of target integrated circuits.

8. The method according to claim 6, wherein a first portion of said plurality of integrated circuits is in a different physical location than a remaining portion of said plurality of integrated circuits.

9. The method according to claim 1, comprising determining, for one or more of said plurality of repeated signals, an amount by which to shift said received signal based on a receive frequency of one or more of said corresponding plurality of target integrated circuits.

10. The method according to claim 1, wherein said first integrated circuit and one or more of said plurality of target integrated circuits are mounted on a single printed circuit board.

11. The system according to claim 1, wherein said first integrated circuit and one or more of said plurality of target integrated circuits are mounted on a single printed circuit board.

12. A system for signal processing, the system comprising:
   one or more circuits in a first integrated circuit, wherein said one or more circuits are enabled to at least:
   receive a first signal via a first antenna;
   frequency shift said first signal by a different amount to generate each of a plurality of repeated signals; and
   transmit, via a second antenna, said generated plurality of repeated signals to a corresponding plurality of target integrated circuits, wherein:
      each of said plurality of repeated signals comprises one or more signal components; and
      a phase and/or amplitude of each of said one or more signal components is adjusted to control a directivity of each of said repeated signals.

13. The system according to claim 12, wherein said one or more circuits are enabled to generate each of said plurality of repeated signals by:
   quadrature down-converting said received first signal by mixing said received first signal with a first of a plurality of phase-quadrature local oscillator signal pairs, said down-conversion resulting in a down-converted signal;

up-converting said down-converted signal by mixing said down-converted signal with a second pair of said plurality of phase-quadrature local oscillator signal pairs, said up-conversion resulting in an up-converted signal; and add or subtract an in-phase portion of said up-converted signal with a quadrature-phase portion of said up-converted signal.

14. The system according to claim 12, wherein at least a portion of said first antenna and/or said second antenna are fabricated on and/or within said integrated circuit.

15. The system according to claim 12, wherein at least a portion of said first antenna and/or said second antenna are fabricated on and/or within a package to which said first integrated circuit is bonded.

16. The system according to claim 12, wherein said first integrated circuit is enabled to extract and/or process information from said received signal.

17. The system according to claim 12, wherein said one or more circuits are enabled to transmit signals from a source integrated circuit to a target integrated circuit via a plurality of said first integrated circuit.

18. The system according to claim 17, wherein a first portion of said plurality of target integrated circuits receive signals on a different frequency than a remaining portion of said plurality of target integrated circuits.

19. The system according to claim 17, wherein a first portion of said plurality of integrated circuits is in a different physical location than a remaining portion of said plurality of integrated circuits.

20. The system according to claim 12, wherein said one or more circuits are enabled to determine, for one or more of said plurality of repeated signals, an amount by which to shift said received signal based on a receive frequency of one or more of said corresponding plurality of target integrated circuits.

* * * * *